(12) United States Patent
Matsumoto

(10) Patent No.: US 8,278,801 B2
(45) Date of Patent: Oct. 2, 2012

(54) PIEZOELECTRIC RESONATOR DEVICE

(75) Inventor: Toshiya Matsumoto, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 526 days.

(21) Appl. No.: 11/991,630

(22) PCT Filed: Sep. 20, 2006

(86) PCT No.: PCT/JP2006/318623
§ 371 (c)(1),
(2), (4) Date: Mar. 24, 2008

(87) PCT Pub. No.: WO2007/040051
PCT Pub. Date: Apr. 12, 2007

(65) Prior Publication Data
US 2009/0127696 A1 May 21, 2009

(30) Foreign Application Priority Data

Sep. 30, 2005 (JP) .................................. 2005-286563

(51) Int. Cl.
*H01L 41/08* (2006.01)
(52) U.S. Cl. ........................................ 310/344; 310/348
(58) Field of Classification Search .................. 310/344, 310/348
See application file for complete search history.

(56) References Cited

U.S. PATENT DOCUMENTS

| 6,700,312 B2 | 3/2004 | Iizuka et al. | |
|---|---|---|---|
| 2005/0184626 A1* | 8/2005 | Chiba et al. | ..................... 310/348 |

FOREIGN PATENT DOCUMENTS

| JP | 10-284972 | 10/1998 |
|---|---|---|
| JP | 2002-158558 | 5/2002 |
| JP | 2004-214787 | 7/2004 |
| JP | 2004-356687 | 12/2004 |
| WO | 01/67600 | 9/2001 |

OTHER PUBLICATIONS

International Search Report mailed Dec. 19, 2006 for International Application No. PCT/JP2006/318623.

* cited by examiner

*Primary Examiner* — Zandra Smith
*Assistant Examiner* — Ali Naraghi
(74) *Attorney, Agent, or Firm* — Marvin A. Motsenbocker; Mots Law, PLLC

(57) ABSTRACT

A package inner peripheral face 13 of a base 4 is made up of a vertical face 14 and a horizontal face 15, and electrode pads 7 (71 to 78) are formed on the vertical face vertical face 14 of the base 4. The electrode pads 71 to 78 are formed on the vertical face 14 of the base 4 including an intersection line 17 at which the vertical face 14 and the horizontal face 15 intersect; for example, electrode pads 74 and 75 that serve as hetero electrodes are formed adjacently. The distance between the electrode pads 74 and 75 that are adjacent along the intersection line 17 of the vertical face 14 of the base 4 is longer than the shortest distance between the electrode pads 74 and 75 that are adjacent on the vertical face 14 of the base 4.

10 Claims, 7 Drawing Sheets ic # PIEZOELECTRIC RESONATOR DEVICE

TECHNICAL FIELD

This invention relates to a piezoelectric resonator device.

BACKGROUND ART

Examples of piezoelectric resonator devices in use today include crystal oscillators and crystal resonators.

In the case of an oscillator, the package that serves as the case of the oscillator is made up of a base and a lid, and the interior of the package is hermetically sealed. Inside this case, a crystal resonator and an oscillation-use IC are bonded via wire bonding, a metal bump, or the like to electrode pads formed on the bottom face of the base or a laminated intermediate layer. The IC is disposed in the lower part of the package interior, and the crystal resonator is supported in the upper part (see Patent Document 1 below, for example).

In the case of a crystal resonator, the package that serves as the case of the resonator is made up of a base and a lid, and the interior of the case is hermetically sealed. Inside this case, a crystal vibration piece is bonded via a conductive bonding material, wire bonding, a metal bump, or the like to electrode pads formed on the bottom face of the base, within a laminated intermediate layer, or the like (see Patent Document 2 below, for example).

Patent Document 1: JP 2002-158558A
Patent Document 2: JP 2004-356687A

DISCLOSURE OF INVENTION

Problem to be Solved by the Invention

Electronic devices today are still becoming smaller, and this is accompanied by a reduction in the size of the above-mentioned crystal oscillators, crystal resonators, and so forth. Accordingly, with the crystal resonator disclosed in the above-mentioned Patent Document 1, for example, the spacing of the positions where the electrode pads are formed on the base for bonding the crystal resonator plate to the base has to be shortened inside the case.

If dust, a solvent, an oxide thin film, or the like should adhere to the surface of the electrode pads on the base, it will decrease the joint strength of the wire bonding or metal bump to the electrode pads. Consequently, a method is currently employed in which the surface of the electrode pads is cleaned prior to the bonding of the electrode pads and the crystal resonator plate. A standard way of cleaning these electrode pads in recent years has been to perform plasma etching or another kind of dry etching in which there is no secondary fouling caused by subsequent steps after cleaning (alkali removal). With the plasma etching method (plasma sputtering) referred to here, accelerated argon ions, oxygen ions, or the like are made to physically collide with the surface of the electrode pads, shaving down the metal surface of the electrode pads, exposing a metal surface of the electrode pads to which no dust, solvent, oxide thin film, or the like adheres, and thereby cleaning the surface of the electrode pads.

When the electrode pads on the above-mentioned base are cleaned by plasma sputtering, however, electrode dust is scattered and re-adheres (is sputtered) onto surfaces that are at an angle to the bottom face of the base, such as the walls of the base. None of this electrode dust re-adheres to the face directly across from the argon ion or oxygen ion emission source (such as the bottom face of the base), but at faces that are at an angle to a face directly across from the emission source (such as the walls of the base that are perpendicular to the emission source), for example, ions emitted from the emission source either do not collide at all or very few collide, and scattered and re-adhered (sputtered) electron dust remains.

Therefore, as crystal resonators become smaller, if the spacing between the positions where the electrode pads are formed on the base to which the crystal resonator plate is bonded is reduced, there is the possibility that electrode pads that serve as hetero electrodes formed adjacently will be connected by electrode dust that has re-adhered to a face that is at an angle to the bottom face of the base, and that this will lead to short-circuiting between adjacent electrode pads.

To avoid this short-circuiting between adjacent electrode pads, with the invention (crystal oscillator) in the above-mentioned Patent Document 1, for example, the region of the base where re-adhesion occurred was covered with a mask member so that electrode dust would not re-adhere, but reductions in the size of crystal oscillators result in a smaller region of the base where re-adhesion occurs, and this makes it difficult to cover just the region of the base where re-adhesion occurs with the mask member. This problem is apt to have an adverse effect with the invention in the above-mentioned Patent Document 1 because an IC is disposed in the lower part inside the package, and a crystal resonator is supported in the upper part near this IC.

In view of this, to solve the above-mentioned problems, it is an object of the present invention to provide a piezoelectric resonator device that avoids a situation in which electrode pads serving as hetero electrodes and formed adjacently on the bottom face of the base become connected on an inner face that is at an angle to the bottom face of the base.

Means for Solving Problem

To achieve the stated object, the piezoelectric resonator device according to the present invention is a piezoelectric resonator device in which a package is constituted by a base and a lid, and on the base are formed a plurality of electrode pads for supporting a piezoelectric resonator plate on which an electrode terminal is formed, and for putting the electrode terminal of the piezoelectric resonator plate in a state of conduction with an external electrode, wherein an inner peripheral face of the package of the base is made up of a plurality of inner faces with different planar directions, and the electrode pads that serve as hetero electrodes are formed adjacently on an inner face having the same planar direction out of the plurality of inner faces that includes an intersection line at which the inner face having the same planar direction intersects with another inner face having another planar direction, and the distance between the adjacent electrode pads along this intersection line is longer than the shortest distance between the adjacent electrode pads on the inner face having the same planar direction.

With the present invention, since the package inner peripheral face of the base is made up of a plurality of inner faces with different planar directions, and the electrode pads that serve as hetero electrodes are formed adjacently on the inner face having the same planar direction out of the plurality of inner faces that includes an intersection line at which the inner face having the same planar direction intersects with another inner face having another planar direction, and the distance between the adjacent electrode pads along this intersection line is longer than the shortest distance between the adjacent electrode pads on the inner faces having the same planar direction, it is possible to avoid a situation in which the electrode pads that serve as hetero electrodes formed adjacently on the inner face having the same planar direction become connected on the other inner face having another planar direction, and it is possible to prevent short-circuiting caused by connection of the electrode pads that serve as hetero electrodes. The present invention is a particularly preferable constitution when the electrode pads on the base are to be cleaned by plasma sputtering. Specifically, when plasma sputtering is used, electrode dust scatters, and this scattered electrode dust re-adheres (is sputtered onto) surfaces that are at an angle to the bottom face of the base, such as the walls of the base, but with the present invention, since the distance between the adjacent electrode pads along the above-mentioned intersection line is longer than the shortest distance between the adjacent electrode pads on the inner face having the same planar direction, it is possible to avoid a situation in which the electrode pads become connected on another inner face having another planar direction. The present invention is preferable for solving the same problems encountered with dry etching methods in general, and not just the above-mentioned plasma sputtering. Furthermore, the present invention is preferable for a crystal vibration device that is reduced in size, because it does not involve avoiding short-circuiting between adjacent electrode pads by using a mask member as in the above-mentioned Patent Document 1.

Also, to achieve the stated object, the piezoelectric resonator device according to the present invention is a piezoelectric resonator device in which a package is constituted by a base and a lid, and on the base are formed a plurality of electrode pads for supporting a piezoelectric vibrating reed and an integrated circuit board on which electrode terminals are formed, and for putting the electrode terminals of the piezoelectric resonator plate and the integrated circuit board in a state of conduction with an external electrode and an internal terminal, wherein an inner peripheral face of the package of the base is made up of a plurality of inner faces with different planar directions, and the electrode pads that serve as hetero electrodes are formed adjacently on an inner face having the same planar direction out of the plurality of inner faces that includes an intersection line at which the inner face having the same planar direction intersects with another inner face having another planar direction, and the distance between the adjacent electrode pads along this intersection line is longer than the shortest distance between the adjacent electrode pads on the inner face having the same planar direction.

With the present invention, since the package inner peripheral face of the base is made up of a plurality of inner faces with different planar directions, and the electrode pads that serve as hetero electrodes are formed adjacently on the inner face having the same planar direction out of the plurality of inner faces that includes an intersection line at which the inner face having the same planar direction intersects with the other inner face having another planar direction, and the distance between the adjacent electrode pads along this intersection line is longer than the shortest distance between the adjacent electrode pads on the inner face having the same planar direction, it is possible to avoid a situation in which the electrode pads that serve as hetero electrodes formed adjacently on the inner face having the same planar direction become connected on the other inner face having another planar direction, and it is possible to prevent short-circuiting caused by connection of the electrode pads that serve as hetero electrodes. The present invention is a particularly preferable constitution when the electrode pads on the base are to be cleaned by plasma sputtering. Specifically, when plasma sputtering is used, electrode dust scatters, and this scattered electrode dust re-adheres (is sputtered onto) surfaces that are at an angle to the bottom face of the base, such as the walls of the base, but with the present invention, since the distance between the adjacent electrode pads along the above-mentioned intersection line is longer than the shortest distance between the adjacent electrode pads on the inner face having the same planar direction, it is possible to avoid a situation in which the electrode pads become connected on another inner face having another planar direction. Furthermore, the present invention is preferable for solving the same problems encountered with dry etching methods in general, and not just the above-mentioned plasma sputtering. Also, the present invention is preferable for a crystal oscillation device that is reduced in size, because it does not involve avoiding short-circuiting between adjacent electrode pads by using a mask member as in the above-mentioned Patent Document 1.

With this constitution, the electrode pads that serve as hetero electrodes may be formed adjacently on the inner face having the same planar direction out of the plurality of inner faces that includes an intersection line at which the inner face having the same planar direction intersects with the other inner face having another planar direction, the distance between the adjacent electrode pads along this intersection line may be set to at least 100 μm, and the shortest distance between the adjacent electrode pads on the inner face having the same planar direction may be set to less than 100 μm.

In this case, since the distance between the adjacent electrode pads along this intersection line is set to at least 100 μm, and the shortest distance between the adjacent electrode pads on the inner face having the same planar direction is set to less than 100 μm, there is greater latitude in the design of the electrode pads on the inner face having the same planar direction. As a result, it is possible to accommodate the increase in wiring of the electrode pads and so forth in this piezoelectric resonator device due to greater functionality (added functions) in devices in which this piezoelectric resonator device is mounted.

With this constitution, the other inner face having another planar direction may be made up of a plurality of faces, and the intersection line may be constituted by a line at which the inner face having the same planar direction intersects with the plurality of other inner faces.

In this case, since the other inner face having another planar direction may be made up of a plurality of faces, and the intersection line may be constituted by a line at which the inner face having the same planar direction intersects with the plurality of other inner faces, it is possible to extend the intersection line. Specifically, since the distance of the intersection line is bent on the inner face having the same planar direction of the base, the intersection line is longer by an amount equal to this bending, and it is possible to extend the intersection line. Accordingly, short-circuiting caused by connection of the electrode pads that serve as hetero electrodes can be prevented. Also, conversely, since this constitution allows the distance to be shortened between adjacent electrode pads, it is preferable in cases in which the package size is reduced.

With this constitution, floating electrode pads may be formed on the inner face having the same planar direction away from the intersection line.

In this case, since floating electrode pads are formed on the inner face having the same planar direction away from the intersection line, a situation can be substantially prevented in which these floating electrode pads and the electrode pads that serve as hetero electrodes formed adjacently become connected on the other inner face having another planar direction. Accordingly, this constitution is preferable when the size of the piezoelectric resonator device is reduced while the number of electrode pads remains the same.

With this constitution, it is preferable if the number of electrode pads formed on the inner face having the same planar direction that includes the intersection line is greater than the number of floating electrode pads.

In this case, since the number of electrode pads formed on the inner face having the same planar direction that includes the intersection line is greater than the number of floating electrode pads, not only is it possible to set as desired the positions where the electrode pads are formed on the inner face having the same planar direction by using the floating electrode pads, but also, since the number of electrode pads formed on the inner face having the same planar direction that includes the intersection line is greater than the number of floating electrode pads, it is possible to suppress a decrease in the strength of the base resulting from the formation of the electrode pads on the inner face having the same planar direction away from the intersection line.

With this constitution, the base may have a laminated portion formed on a bottom portion, through-holes may be provided at or near the location on the bottom portion where the laminated portion is formed, and the electrode pads inside the package may be electrically connected to the outside of the package via the through-holes.

In this case, since the base has a laminated portion formed on a bottom portion, through-holes are provided at or near the location on the bottom portion where the laminated portion is formed, and the electrode pads inside the package are electrically connected to the outside of the package via the through-holes, it is possible for the laminated portion to suppress a decrease in the strength of the base resulting from the formation of the through-holes.

With this constitution, electrodes may be formed on the inner peripheral faces of the through-holes, and the center portions of the through-holes may be filled with a resin.

In this case, since electrodes are formed on the inner peripheral faces of the through-holes, and the center portions of the through-holes are filled with a resin, this is preferable in terms of lowering the manufacturing cost because the electrode pads, which are metal, do not completely fill the through-holes. Also, the electrodes formed along the inner peripheral faces of the through-holes prevent discontinuity with the electrode pads. Also, the filling of the through-holes with the resin can be facilitated.

With this constitution, the electrode pads may be composed of a plurality of layers, and the thickness of the uppermost layer may be not more than 1.0 µm.

In this case, since the thickness of the uppermost layer of the electrode pads is not more than 1.0 µm, it is possible to avoid short-circuiting between adjacent electrode pads that would otherwise be caused by electrode dust from the electrode pads, which scatters during the formation of the electrode pads. This constitution is particularly preferable when the electrode pads on the base are to be cleaned by plasma sputtering, and furthermore this is preferable for solving the same problems encountered with dry etching methods in general, and not just the above-mentioned plasma sputtering. As a result, there is greater latitude in the design of the electrode pads on the inner face having the same planar direction.

Effects of the Invention

With the piezoelectric resonator device according to the present invention, it is possible to avoid a situation in which electrode pads that serve as hetero electrodes formed adjacently on the inner face having the same planar direction of a base become connected on another inner face having another planar direction. For instance, it is possible to avoid a situation in which electrode pads that serve as hetero electrodes formed adjacently on the bottom face of the base become connected on an inner face (side wall) that is at an angle to the bottom face of the base.

Figure 1:
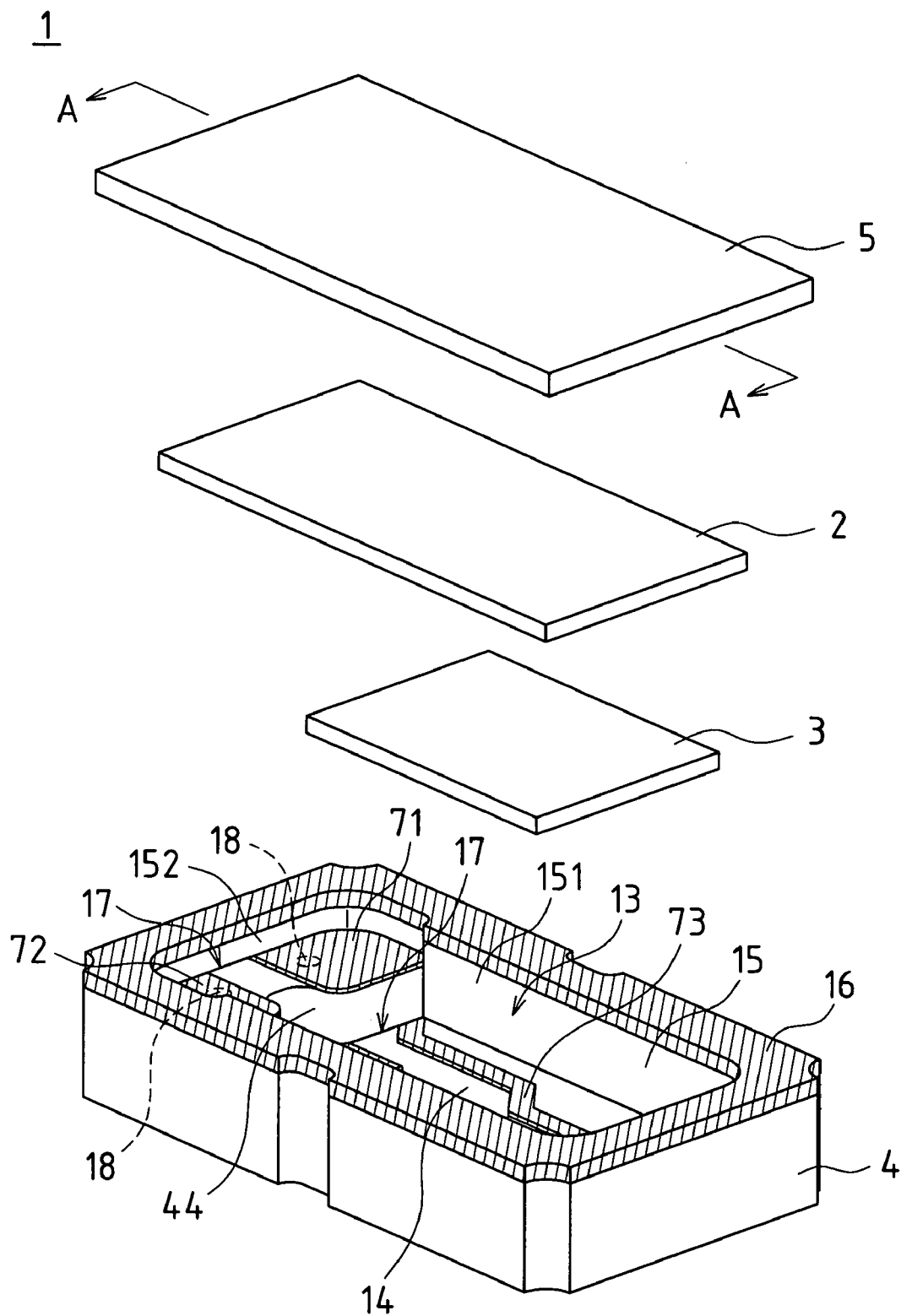
FIG. 1 is a simplified, exploded perspective view of a crystal oscillator according to a working example.

DESCRIPTION OF REFERENCE NUMERALS 1 crystal oscillator (piezoelectric resonator device)
11 package
14 vertical face (inner face having the same planar direction)
15 horizontal face (another inner face having another planar direction)
17 intersection line
18 through-hole
181 resin
182 electrode
2 crystal resonator plate (piezoelectric resonator plate)
3 integrated circuit board
4 base
41 bottom face
42 laminated portion
5 lid
7 (71 to 79) electrode pad
76, 79 floating electrode pads

BEST MODE FOR CARRYING OUT THE INVENTION

Embodiments of the present invention will now be described through reference to the drawings. The working examples given below illustrate a case of applying the present invention to a crystal oscillator as a piezoelectric resonator device.

Figure 2:
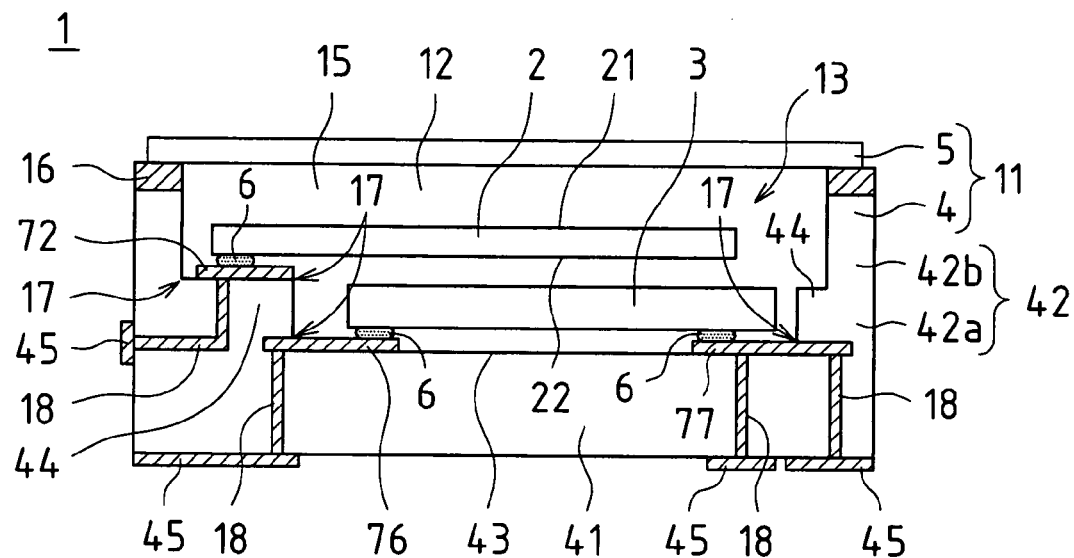
FIG. 2 is a simplified cross section along the A-A line in FIG. 1, of the manufactured state of the crystal oscillator according to the working example shown in FIG. 1.

As shown in FIGS. 1 and 2, a crystal oscillator 1 according to this working example comprises an AT-cut crystal resonator plate (hereinafter referred to as crystal resonator plate) 2 discussed below, an integrated circuit board 3 for an oscillation circuit, a base 4 that supports the crystal resonator plate 2 and the integrated circuit board 3, and a lid 5 for hermetically sealing the crystal resonator plate 2 and the integrated circuit board 3 supported on the base 4.

With this crystal oscillator 1, as shown in FIGS. 1 and 2, the base 4 and the lid 5 constitute a package 11, and the base 4 and lid 5 are bonded to form an inside space 12 that is hermetically sealed within the package 11. In this inside space 12, the integrated circuit board 3 is bonded by FCB via metal bumps 6 to a bottom face 43 (see below) of the base 4 in the lower part of the interior, and the crystal resonator plate 2 is bonded to the base 4 by FCB via metal bumps 6 above the integrated circuit board 3 to be supported on the base 4.

Various configurations of the crystal oscillator 1 will now be described.

Figure 3:
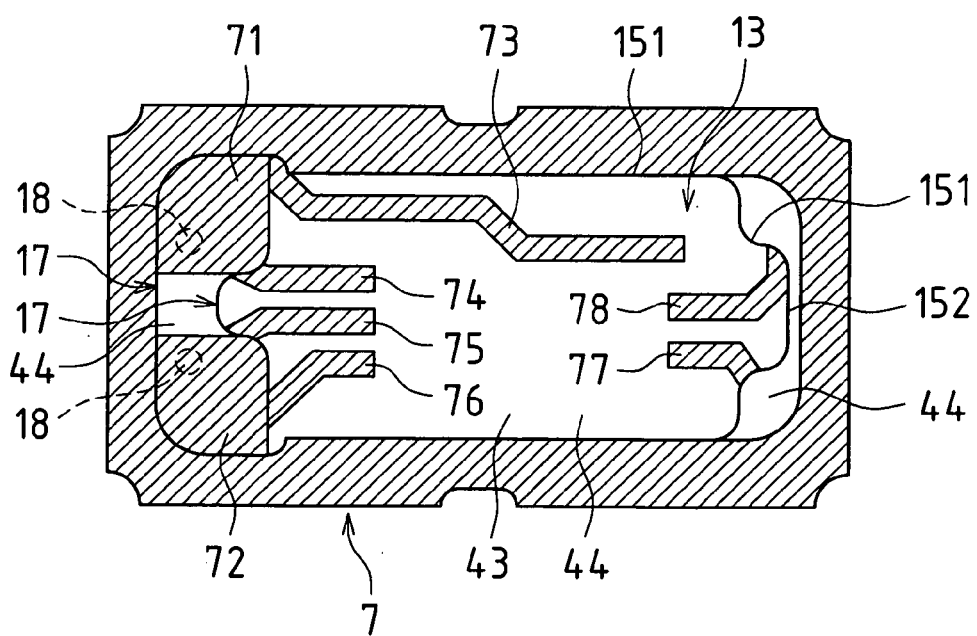
FIG. 3 is a simplified plan view of the base of the crystal oscillator according to this working example.

As shown in FIGS. 1 to 3, the base 4 is made up of a bottom portion 41 and a laminated portion 42 (first and second laminated portions 42a and 42b discussed below) that is laminated over the bottom portion 41. The laminated portion 42, as shown in FIGS. 1 to 3, is a wall portion laminated on the outer edges of the bottom portion 41, and this laminated portion 42 extends from the four corners of the inside space 12 to form a stepped portion 44. The bottom portion 41 and laminated portion 42 form the box-shaped base 4 that is open at the top. The upper face of the laminated portion 42 is the region where the lid 5 is bonded, and this bonding region is provided with a metallization layer (not shown) for bonding the lid 5. This base 4 is produced by laminating a parallelepiped made of a ceramic material over a single plate of alumina or another such ceramic material that is rectangular in plan view, and these are fired and integrated into a concave shape. Also, as shown in FIG. 3, this base 4 is formed such that a plan view of its external shape is a substantially rectangular shape made up of long sides and short sides.

Also, as shown in FIGS. 1 to 3, electrode pads 7 (71 to 78) (discussed below) are formed on the open faces of the base 4 in the inside space 12 of the base 4, that is, on the bottom face 43 of the base 4 and the surface of the stepped portion 44. The electrode pads 71 and 72 formed on the surface of the stepped portion 44 are electrode pads that are bonded to electrode terminals (not shown) of the crystal resonator plate 2, and these electrode pads 71 and 72 are hetero electrodes. The electrode pads 73 to 78 formed on the bottom face 43 of the base 4 are electrode pads that are bonded to electrode terminals (not shown) of the integrated circuit board 3, and the electrode pads 73, 75, and 77 are hetero electrodes to the electrode pads 74, 76, and 78. These electrode pads 7 are electrically connected to external terminals 45 formed on the back side of the base 4 via electrodes 182 (see FIG. 4) of through-holes 18 (discussed below). These external terminals 45 are connected to external components or external devices, and are used as output terminals, power supply terminals, and ground terminals for the crystal oscillator 1 made up of the crystal resonator plate 2 and the integrated circuit board 3. The electrode pads 7, the electrodes 182 of the through-holes 18, and the external terminals 45 are produced by printing with tungsten, molybdenum, or another such metallization material, and then firing to integrate with the base 4. Of the electrode pads 7, the electrodes 182 of the through-holes 18, and the external terminals 45, a part (such as the electrode pads 7) have nickel plating formed over the top of the metallization, and gold plating over the top of this nickel plating. More specifically, the electrode pads 7 are composed of a plurality of layers (three layers in this working example: metallization, nickel plating, and gold plating), and gold plating is formed over the top (the uppermost layer) of the electrode pads 7.

A package inner peripheral face 13 of the base 4 is made up of a plurality of inner faces with different planar directions. More specifically, as shown in FIGS. 2 and 3, the package inner peripheral face 13 of the base 4 is made up of a face with which the bottom face 43 and the surface of the stepped portion 44 of the base 4 are oriented in the same direction (hereinafter this face will be referred to as the horizontal face 14), and face that are oriented perpendicularly to this vertical face (hereinafter these faces will be referred to as the vertical faces 15). As shown in FIGS. 2 and 3, the vertical faces 15 are made up of length-direction vertical faces 151 and width-direction vertical faces 152. Specifically, in this working example, the package inner peripheral face 13 of the base 4 is made up of an inner face oriented in three directions. The horizontal face 14 and vertical faces 15 referred to here are faces oriented substantially in the horizontal direction and vertical direction, respectively, and are not limited to faces oriented strictly in the horizontal direction and vertical direction.

The lid 5 is composed of kovar or another such metal material, and as shown in FIGS. 1 and 2, it is formed as a single plate that is rectangular in plan view. This lid 5 has solder 16 formed on its lower side, and is bonded to the base 4 by seam welding, so that the lid 5 and the base 4 constitute the package 11 of the crystal oscillator 1. The "inside space 12" in this working example refers to a region that is hermetically sealed by the lid 5 and the base 4. The lid 5 may be made of a ceramic material, and an airtight seal may be obtained by interposing a glass material.

A plurality of electrode terminals (not shown) are formed on the bottom face of the integrated circuit board 3 disposed in the inside space 12. These electrode terminals are electrically connected by FCB via the metal bumps 6 composed of gold, to the electrode pads 73 to 78 on the bottom face 43 of the base 4, and are supported on the bottom face 43 of the base 4.

The crystal resonator plate 2 disposed in the inside space 12 is composed of a rectangular AT-cut crystal plate, and is formed on a parallelepiped made of a single plate having a rectangular shape in plan view. On the two main faces 21 and 22 of this crystal resonator plate 2 are formed electrode terminals (not shown) composed of a pair of excitation electrodes (not shown) and take-off electrodes (not shown) that are taken off from the excitation electrodes in order to electrically connect these excitation electrodes to external electrodes (in this working example, the electrode pads 71 and 72 of the base 4 as discussed below). The electrode terminals of this crystal resonator plate 2 are formed by sputtering or another such thin-film formation methods. For example, they can be formed by laminating from the crystal vibrating plate side first chromium and then gold, or first chromium, then gold, and then chromium, or first chromium, then silver, then chromium. These electrode terminals are electrically connected by FCB via the metal bumps 6 composed of gold, to the electrode pads 71 and 72 on the surface of the stepped portion 44 of the base 4, and are supported on the surface of the stepped portion 44 of the base 4.

As shown in FIGS. 2 and 3, the electrode pads 71 to 78 are formed on the horizontal face 14 of the base 4 including an intersection line 17 at which the horizontal face 14 and the vertical faces 15 intersect. Also, the electrode pads that serve as hetero electrodes (the electrode pads numbered 74 and 75 are used as examples here; the same applies below) are formed adjacently. The distance between the electrode pads 74 and 75 adjacent along this intersection line 17 of the horizontal face 14 of the base 4 is longer than the shortest distance between the adjacent electrode pads 74 and 75 on the horizontal face 14 of the base 4 (the bottom face 43 and the surface of the stepped portion 44). More specifically, the distance between the electrode pads 74 and 75 adjacent along the intersection line 17 of the horizontal face 14 of the base 4 is set to at least 100 µm, and the shortest distance between the adjacent electrode pads 74 and 75 on the horizontal face 14 of the base 4 (the bottom face 43 and the surface of the stepped portion 44) is set to less than 100 µm. In this working example, taking the electrode pads 74 and 75 as examples, the distance between the electrode pads 74 and 75 adjacent along the intersection line 17 of the horizontal face 14 of the base 4 is set to 120 µm, and the shortest distance between the electrode pads 74 and 75 adjacent on the horizontal face 14 of the base 4 is set to 30 µm. The distance between the electrode pads 7 that serve as hetero electrodes (such as the electrode pads 74 and 75) is not limited to this, however. Accordingly, for example, the distance between the electrode pads 74 and 75 along the intersection line 17 of the horizontal face 14 of the base 4 may be set to 100 µm, and the shortest distance between the electrode pads 74 and 75 on the horizontal face 14 of the base 4 may be set to 45 µm.

Also, as shown in FIGS. 2 and 3, the intersection line 17 is the line at which the horizontal face 14 and the vertical faces 15 intersect. Accordingly, because the stepped portion 44 is formed, the intersection line 17 according to this working example is a line that follows the shape of the stepped portion 44, and as shown in FIGS. 2 and 3, the intersection line 17 between the electrode pads 74 and 75 is approximately the line at which the longitudinal-direction vertical faces 151 in two planar directions and the width-direction vertical face 152 (substantially three faces) intersect with the bottom face 43.

Figure 4:
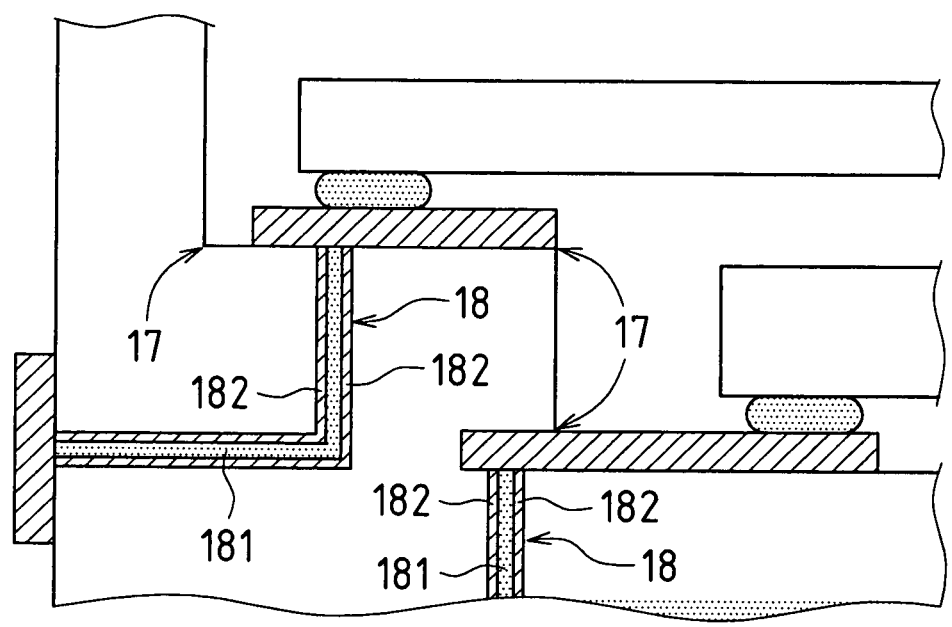
FIG. 4 is a simplified enlarged view of the through-holes shown in FIG. 2.

Also, as shown in FIGS. 2 and 3, through-holes 18 are provided at or near the position where the laminated portion 42 is formed above the bottom portion 41. These through-holes 18 correspond to the electrode pads 71 to 78, and the electrode pads 71 to 78 inside the package 11 are electrically connected to the external terminals 45 on the outside of the package 11 via these through-holes 18. The through-holes 18 are filled with resin 181. More specifically, as shown in FIG. 4, electrodes 182 are formed on the inner peripheral faces of the through-holes 18, and the resin 181 fills the center part of the through-holes 18.

The steps of manufacturing the above-mentioned crystal oscillator 1 will now be described through reference to the drawings.

The first laminated portion 42a for forming the stepped portion 44 is laminated over the bottom portion 41 of the base 4, the second laminated portion 42b that includes a region for bonding the lid 5 is laminated over the first laminated portion 42a, and the base portion 41, and the first and second laminated portions 42a and 42b are fired and integrated into a concave shape, thereby forming a box-shaped base 4 that is open above as shown in FIGS. 1 to 3.

Figure 5:
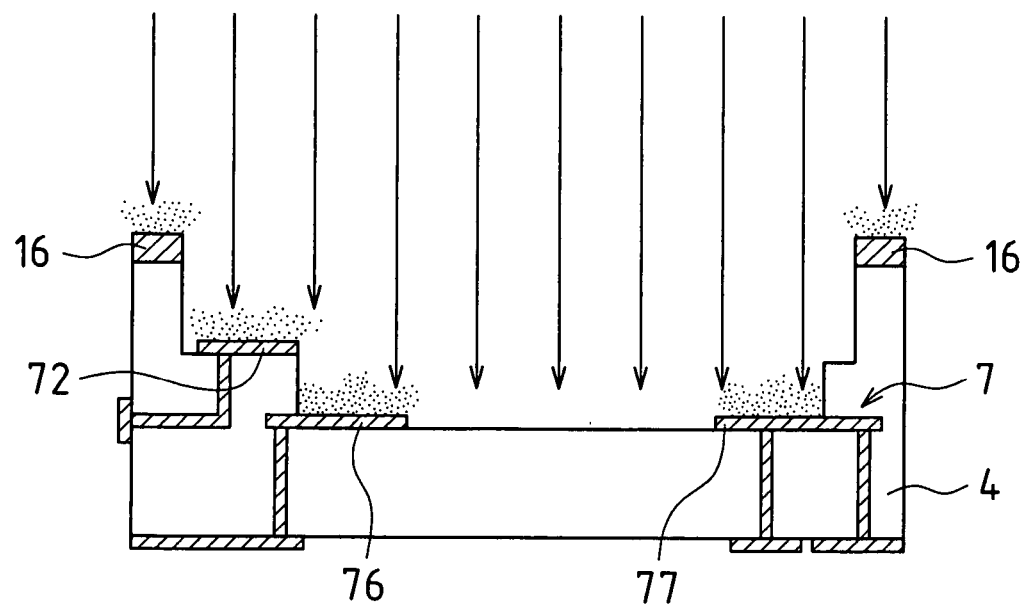
FIG. 5 is a simplified step diagram showing the cleaning step out of the steps for manufacturing the crystal oscillator according to this working example.

The base 4 that is formed in a box shape as discussed above is cleaned by plasma etching (by plasma sputtering) to remove any dust, solvent, oxide thin film, or the like adhering to the electrode pads 7 (cleaning step). More specifically, in this cleaning step, as shown in FIG. 5, accelerated argon ions are sent from the opening in the base 4 and made to physically collide with the surface of the electrode pads 7, shaving down the surface of the electrode pads 7, exposing a metal surface of the electrode pads that has not been fouled, and thereby cleaning the surface of the electrode pads 7. This cleaning shaves down the metal surface of the electrode pads 7 which is metal and activates the surface of the electrode pads 7, whereas the base 4 itself, which is composed of a ceramic with a higher molecular weight than that of argon ions, is hardly shaved at all. Performing dry etching by plasma sputtering or the like as in this working example is preferable in that it increases the joint strength between the electrode pads 7 of the base 4 and the electrode terminals of the crystal resonator plate 2 or integrated circuit board 3. The thickness of the gold plating formed on the uppermost layer of the electrode pads 7 in this cleaning step is set to 1.0 µm or less, and in this working example is 0.8 µm. It is discussed in detail below (see FIG. 11) that the thickness of the gold plating on the electrode pads 7 in this process is set to 1.0 µm or less.

Figure 6:
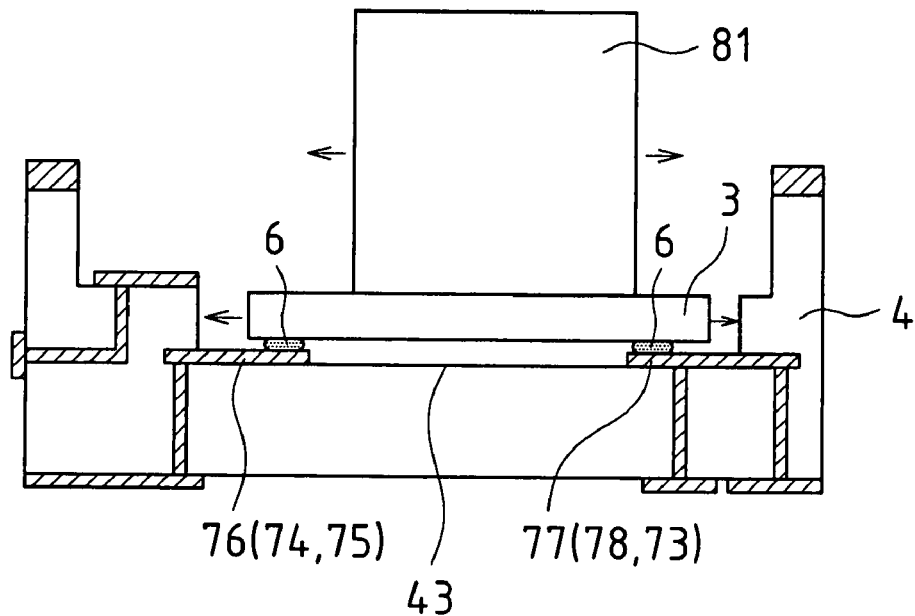
FIG. 6 is a simplified step diagram showing the step of bonding an integrated circuit board out of the steps for manufacturing the crystal oscillator according to this working example.

After the surface of the electrode pads 7 has been cleaned in the cleaning step as discussed above, the integrated circuit board 3 is bonded to the base 4 (integrated circuit board 3 bonding step). Prior to this integrated circuit board 3 bonding step, the metal bumps 6 are bonded to the electrode terminals on the back side of the integrated circuit board 3. The metal bumps 6 bonded to the integrated circuit board 3 are disposed corresponding to the electrode pads 73 to 78 formed on the bottom face 43 of the base 4, and as shown in FIG. 6, the metal bumps 6 are bonded to the electrode pads 73 to 78 by FCB, thereby bonding the integrated circuit board 3 to the base 4. With the FCB referred to here or another such method, the integrated circuit board 3 is pressed under load to the base 4 side with a bonding tool 81 while the surfaces of the metal bumps 6 and the electrode pads 73 to 78 of the base 4 are bombarded with ultrasonic waves, thereby bonding the integrated circuit board 3 to the base 4. The base 4 itself may in some cases be heated somewhat.

Figure 7:
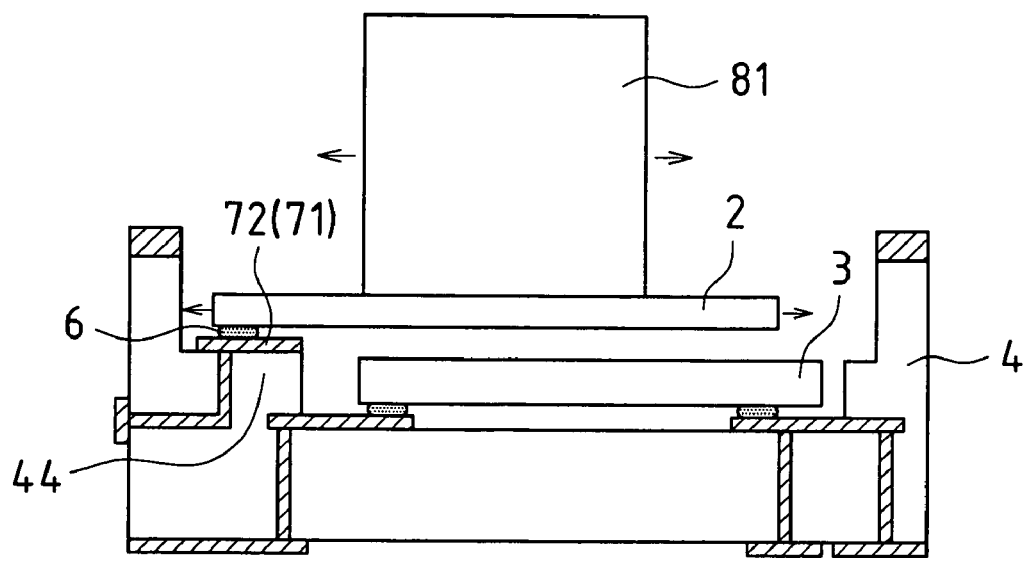
FIG. 7 is a simplified step diagram showing the step of bonding a crystal resonator plate out of the steps for manufacturing the crystal oscillator according to this working example.

After the integrated circuit board 3 bonding step, the crystal resonator plate 2 is bonded to the surface of the stepped portion 44 of the base 4 (crystal resonator plate 2 bonding step). This crystal resonator plate 2 bonding step is substantially the same as the integrated circuit board 3 bonding step discussed above. Specifically, prior to this crystal resonator plate 2 bonding step, the metal bumps 6 are bonded to the electrode terminals on the back side of the crystal resonator plate 2. The metal bumps 6 bonded to the crystal resonator plate 2 are disposed corresponding to the electrode pads 71 and 72 formed on the surface of the stepped portion 44 of the base 4, and as shown in FIG. 7, the metal bumps 6 are bonded to the electrode pads 71 and 72 by FCB or another such method, thereby bonding the crystal resonator plate 2 to the base 4. Alternatively, the metal bumps 6 are bonded to the surface of the stepped portion 44 of the base 4, and the crystal resonator plate 2 is bonded by FCB or another such method.

Figure 8:
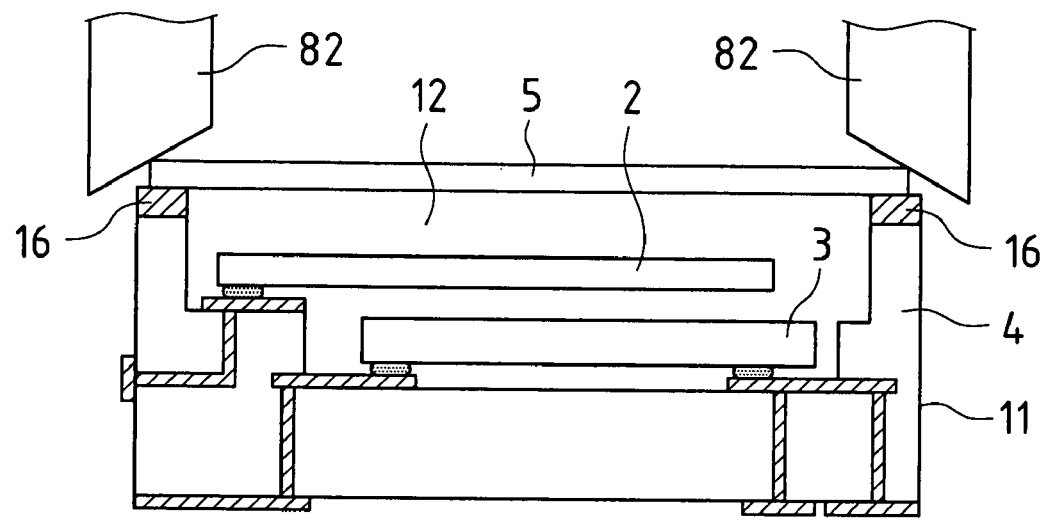
FIG. 8 is a simplified step diagram showing the step of bonding a lid out of the steps for manufacturing the crystal oscillator according to this working example.

After the integrated circuit board 3 and the crystal resonator plate 2 have been bonded to the base 4 as discussed above, the lid 5 is disposed over the second laminated portion 42b of the base 4 so as to block off the opening in the base 4. Then, as shown in FIG. 8, the sides of the lid 5 are seam-sealed by applying current to a metal roller 82, thereby hermetically sealing the inside space 12 of the package 11 (lid 5 bonding step) and manufacturing the crystal oscillator 1.

As discussed above, with the crystal oscillator 1 according to this working example, the package inner peripheral face 13 of the base 4 is made up of the horizontal face 14 and the vertical faces 15 having different planar directions, the electrode pads 74 and 75, for example, are formed adjacently as hetero electrodes on the horizontal face 14 including the intersection line 17 where the horizontal face 14 and the vertical faces 15 intersect, and the distance between the electrode pads 74 and 75 along the intersection line 17 is longer than the shortest distance between the electrode pads 74 and 75 on the horizontal face 14, so a situation can be avoided in which the electrode pads 74 and 75 that serve as hetero electrodes formed adjacently on the horizontal face 14 become connected on the vertical faces 15, and short-circuiting due to connection of these electrode pads 74 and 75 serving as hetero electrodes can be prevented. The crystal oscillator 1 according to this working example is a particularly preferable configuration when the electrode pads 7 on the base 4 are to be cleaned by plasma sputtering. Specifically, when plasma sputtering is used, electrode dust scatters, and this scattered dust re-adheres to (is sputtered onto) the vertical faces 15 (151, 152) of the base 4, but with the crystal oscillator 1 according to this working example, since the distance between the electrode pads 74 and 75 along the intersection line 17 is longer than the shortest distance between the electrode pads 74 and 75 on the horizontal face 14 (more specifically, the distance between the electrode pads 74 and 75 adjacent along the intersection line 17 is set to at least 100 µm, while the shortest distance between the electrode pads 74 and 75 adjacent on the horizontal face 14 is set to less than 100 µm), a situation can be avoided in which the electrode pads 7 formed on the horizontal face 14 of the base 4 become connected on the vertical faces 15 (151, 152). Furthermore, the crystal oscillator 1 according to this working example is preferable for solving the same problems encountered with dry etching methods in general, and not just the above-mentioned plasma sputtering. Also, the crystal oscillator 1 according to this working example is preferable for reducing the size of the package 11, because it does not involve avoiding short-circuiting between adjacent electrode pads by using a mask member as in the above-mentioned Patent Document 1.

Since the distance between the electrode pads 7 (such as the electrode pads 74 and 75) adjacent along the intersection line 17 is set to at least 100 µm, and the shortest distance between the electrode pads 7 (such as the electrode pads 74 and 75) adjacent on the horizontal face 14 is set to less than 100 µm, there is greater latitude in the design of the electrode pads 7 on the horizontal face 14. As a result, it is possible to accommodate the increase in wiring of the electrode pads 7 and so forth in this crystal oscillator 1 due to greater functionality (added functions) in devices in which this crystal oscillator 1 is mounted.

Also, since the package inner peripheral face 13 of the base 4 is made up of the horizontal face 14 and the plurality of vertical faces 15, and the intersection line 17 is constituted by a line at which the horizontal face 14 and the vertical faces 15 of the base 4 intersect, it is possible to extend the intersection line 17. Specifically, since the distance of the intersection line 17 is bent on the horizontal face 14 (bottom face 43) of the base 4 as shown in FIGS. 1 to 3, the intersection line 17 is longer by an amount equal to this bending, and it is possible to extend the intersection line 17. Accordingly, short-circuiting caused by connection of the electrode pads 74 and 75 that serve as hetero electrodes, for example, can be prevented. Also, since this constitution allows the distance to be shortened between adjacent electrode pads 7, such as the electrode pads 74 and 75, it is preferable in cases in which the package 11 is reduced in size. In particular, since this is a configuration in which the convex or concave vertical faces 15 are interposed between the electrode pads 7 by interposing a bending point (inflection point), produced by bending the intersection line 17, between the electrode pads 7 (such as the electrode pads 74 and 75, the electrode pads 75 and 76, etc.), the distance along the intersection line 17 between the electrode pads 7 can be increased. As a result, short-circuiting at the vertical faces 15 can be prevented while the distance between the electrode pads 7 on the horizontal face 14 can be shortened, so this is a preferable mode for reducing the size of the package 11.

Also, since the laminated portion 42 is formed on the bottom portion 41 of the base 4, and the through-holes 18 are provided as shown in FIG. 3 at or near the location on the bottom portion 41 where the laminated portion 42 is formed, and the electrode pads 71 to 78 inside the package 11 are electrically connected to the external terminals 45 on the outside of the package 11 via the through-holes 18, the laminated portion 42 suppresses a decrease in the strength of the base 4 resulting from the formation of the through-holes 18.

Also, as shown in FIG. 4, since the electrodes 182 are formed around the inner peripheral faces of the through-holes 18, and the center portion of the through-holes 18 is filled with the resin 181, this is preferable in terms of lowering the manufacturing cost because the electrode pads, which are metal, do not completely fill the through-holes 18. Also, the electrodes formed along the inner peripheral faces of the through-holes 18 prevent discontinuity with the electrode pads 71 to 78. Also, the filling of the through-holes 18 with the resin 181 can be facilitated.

Furthermore, an AT-cut crystal resonator plate was used as the piezoelectric resonator plate with this working example as described above, but the present invention is not limited to this, and an acoustic type of crystal resonator plate may be used instead. Also, crystal was used as the material of the piezoelectric resonator plate, but the material is not limited to crystal, and may instead be a piezoelectric ceramic or $LiNbO_3$ or another such piezoelectric single-crystal material. In other words, any piezoelectric resonator plate can be applied as desired.

Also, the crystal resonator plate 2 and the integrated circuit board 3 were used in this working example, but the present invention is not limited to this, and the number of crystal resonator plates 2 may be set as desired. Whether or not the integrated circuit board 3 is used at all may also be determined as desired. That is, the members mounted on the base can be determined or modified as dictated by the application, and just the crystal resonator plate 2 alone may be used.

Also, the above-mentioned seam sealing was used in the sealing step in this working example, but the present invention is not limited to this, and seam sealing may be performed with a kovar ring interposed, or something other than seam sealing may be used, and beam sealing (using a laser beam or electron beam, for example), glass sealing, or the like may be used instead.

Also, plasma etching using argon ions was performed in the cleaning step in this working example, but this is just a preferable example, and the present invention is not limited to this, and plasma etching using oxygen ions may be used. Also in this working example, plasma etching was used in the cleaning step, but this is just a preferable example, and some other dry etching step may be used instead. That is, ion milling, or dry etching using reactive gas ions, or the like may be used.

The shape of the laminated portion 42 is not limited to what is shown in FIGS. 1 to 3, and any shape may be used as long as it allows the inside space 12 of the package 11 to be hermetically sealed.

Also, the crystal resonator plate 2 and the integrated circuit board 3 were bonded to the base 4 via the metal bumps 6 in this working example, but the present invention is not limited to this. That is, something other than the metal bumps 6 may be used, for example, and the crystal resonator plate 2 or the integrated circuit board 3 may be bonded to the base 4 via a conductive bonding material or wire bonding. Furthermore, when wire bonding is employed for bonding the integrated circuit board 3 to the base 4, for example, after the integrated circuit board 3 has been die bonded to the bottom face 43, the electrode pads 73 to 78 of the base 4 are electrically connected to electrode terminals on the surface of the integrated circuit board 3 by bonding with metal wires of gold or the like. When a conductive bonding material is employed for bonding the crystal resonator plate 2 to the base 4, the conductive bonding material is heat cured to bond the electrode terminals of the crystal resonator plate 2 to the electrode pads 71 and 72 on the surface of the stepped portion 44 of the base 4, and support the crystal resonator plate 2 on the surface of the stepped portion 44 of the base 4. Examples of the conductive bonding material referred to here include silicon containing a plurality of silver fillers.

Also, the package inner peripheral face 13 of the base 4 was constituted by an inner face oriented in three directions in this working example, but is not limited to this, and may be an inner peripheral face oriented in another plurality of directions, and it is particularly preferable for it to be constituted by an inner face oriented in four or more directions because the intersection line 17 will cover a longer distance. Also, an inclined face may be formed at an angle to the horizontal face 14 and the vertical faces 15.

Also, the distance between the electrode pads 74 and 75 adjacent along the intersection line 17 on the bottom face 43 of the base 4 was set in this working example to be longer than the shortest distance between the electrode pads 74 and 75, but this definition among the electrode pads 7 is not limited to the electrode pads 74 and 75. That is, the two adjacent electrode pads 7 may, for example, be the electrode pads 77 and 78 on the bottom face 43 of the base 4, or may be the electrode pads 71 and 72 on the surface of the stepped portion 44 of the base 4. Furthermore, these may be the electrode pad 75 on the bottom face 43 of the base 4, and the electrode pad 72 on the surface of the stepped portion 44 of the base 4. In other words, there are no limitations on the direction in which the electrode pads 7 are adjacent. More specifically, the present invention was described using the electrode pads 74 and 75 as an example in this working example, but is not limited to this, and if the "adjacent electrode pads" referred to in the present invention are the electrodes 71 and 72, then the layout design of the electrode pads 71 and 72 on the package inner peripheral face 13 is modified so that the distance between the electrode pads 71 and 72 along the intersection line 17 will be longer than the shortest distance between the electrode pads 71 and 72, in which case the electrode pads 71 and 72 correspond to the adjacent electrode pads referred to in the present invention.

Figure 9:
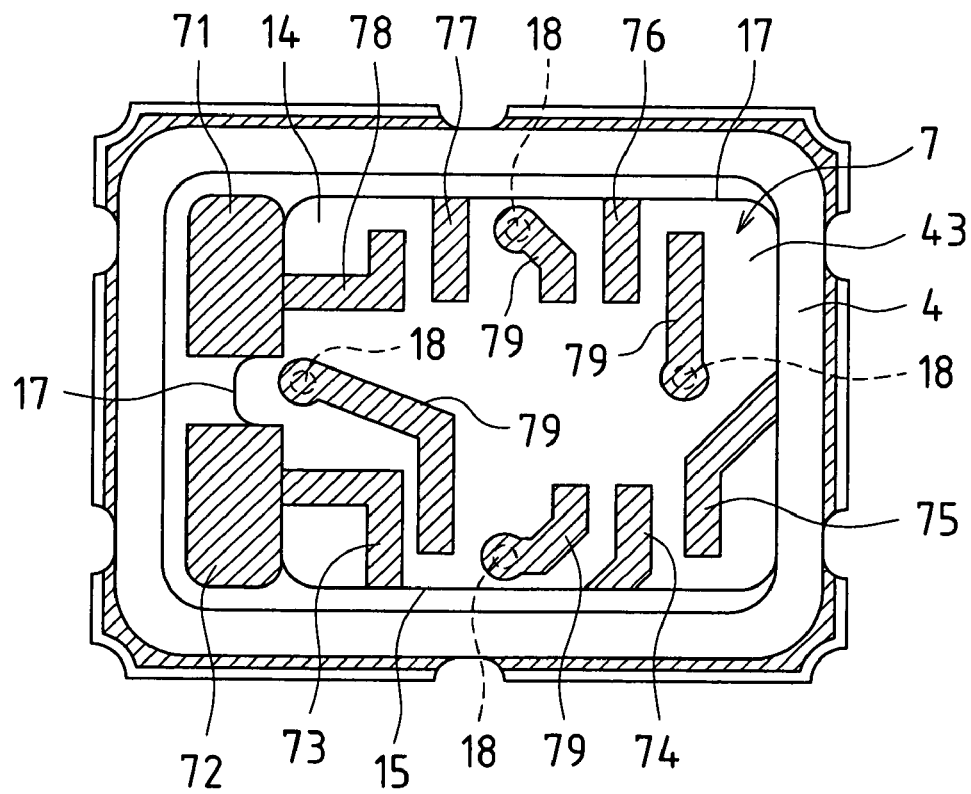
FIG. 9 is a simplified plan view of the base of the crystal oscillator according to another aspect of this working example.

Also, the above-mentioned electrode pads 7 were all formed on the horizontal face 14 of the base 4 including the intersection line 17, but the locations where the electrode pads 7 are formed are not limited to this, and the electrode pads 7 may be formed at the locations on the base 4 shown in FIG. 9, for example. With the electrode pads 7 shown in FIG. 9, the electrode pads 73 to 78 are formed on the horizontal face 14 of the base 4 including the intersection line 17, and floating electrode pads 79 are formed on the bottom face 43 of the base 4 away from the intersection line 17. More specifically, a floating electrode pad 79 is formed between each of the electrode pads 73 and 78, 73 and 74, 75 and 76, and 76 and 77 that serve as hetero electrodes and are formed adjacently on the bottom face 43 of the base 4 including the intersection line 17. Furthermore, in this working example the number (six) of electrode pads 73 to 78 formed on the bottom face 43 of the base 4 including the intersection line 17 is set to be greater than the number (four) of these floating electrode pads 79. Furthermore, in this example, the electrode pad 73 and the floating electrode pad 79 are used as an example in which the shortest distance between the floating electrode pad 79 and the electrode pad 73 on the horizontal face 14 of the base 4 is set to 55 μm.

As discussed above, by forming the floating electrode pads 79 on the bottom face 43 away from the intersection line 17, it is possible to substantially avoid a situation in which these floating electrode pads 79 become connected on the vertical faces 15 with the electrode pads 73 to 78 that serve as hetero electrodes formed adjacently. Accordingly, this configuration is preferable when the size of the crystal oscillator 1 is reduced while the number of electrode pads remains the same.

Also, using the floating electrode pads 79 not only allows the locations where the electrode pads 73 to 78 are formed on the horizontal face 14 (bottom face 43) of the base 4 to be set as desired, but also suppresses a decrease in the strength of the base 4 that would otherwise result from the formation of the floating electrode pads 79 in the horizontal face 14 (bottom face 43) of the base 4, because the number of electrode pads 73 to 78 formed on the horizontal face 14 (bottom face 43) of the base 4 including the intersection line 17 is greater than the number of floating electrode pads 79.

The locations where the electrode pads 7 are formed are not limited to those shown in FIG. 9, and can be varied according to the layout, orientation, and so forth in which the crystal resonator plate 2 and the integrated circuit board 3 are disposed on the base 4. More specifically, the electrode pads 7 may be formed in the locations shown in FIG. 10.

Figure 10:
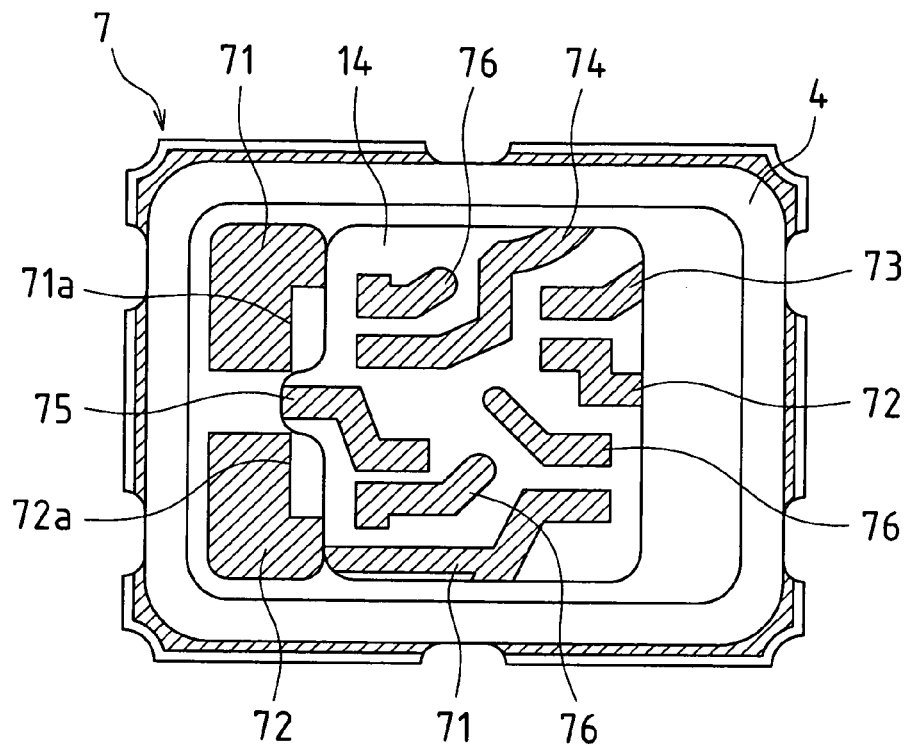
FIG. 10 is a simplified plan view of the base of the crystal oscillator according to another aspect of this working example.

In FIG. 10, the electrode pads 7 (71 to 76) are formed so that the longitudinal direction of the crystal resonator plate 2 is perpendicular to the longitudinal direction of the integrated circuit board 3. More specifically, the electrode pads 71 and 72 are electrode pads used for the crystal resonator plate 2, the electrode pads 73 to 76 are electrode pads used for the integrated circuit board 3, and electrode pads 7 that are adjacent to one another are hetero electrodes. With the integrated circuit board 3 electrically connected to and supported by the electrode pads 73 to 76, the center of the integrated circuit board 3 is positioned away from the center position of the base 3. Accordingly, as shown in FIG. 10, the crystal resonator plate 2 and the integrated circuit board 3 are supported with their centers of gravity offset on the base 3. In FIG. 10, cut-out portions 71a and 72a are provided in part of the electrode pads 71 and 72. This increases the joint strength when the crystal resonator plate 2 is bonded to the electrode pads 71 and 72 by bonding the crystal resonator plate 2 to the bare plate of the base 4 as well, with a conductive resin adhesive such as silicone (conductive bonding material) interposed, for example. Furthermore, short-circuiting with nearby electrode pads 7 (such as the electrode pad 75) can be prevented by providing the cut-out portions 71a and 72a in part of the electrode pads 71 and 72.

Figure 11:
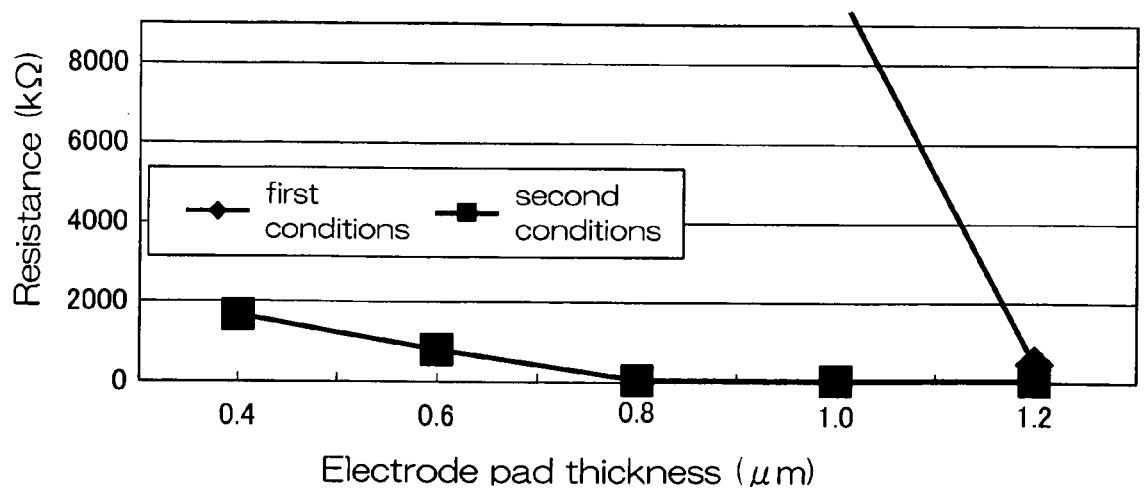
FIG. 11 is a graph of the relationship between resistance and thickness of the electrode pads in a crystal oscillator resulting from a modification of the cleaning conditions in the cleaning step out of the steps for manufacturing the crystal oscillator according to this working example.

As shown in the above steps for manufacturing the crystal oscillator 1, the thickness of the gold plating formed on the uppermost layer of the electrode pads 7 shown in FIGS. 9 and 10 in the cleaning process is set to 1.0 μm or less for each, and more specifically, 0.8 μm. The setting of the thickness of the gold plating of the electrode pads 7 to be 1.0 μm or less here will be described in detail through reference to FIG. 11. As discussed above, this cleaning step is a step in which the base 4 that is formed in a box shape is cleaned to remove dust, solvent, oxide thin film, or the like adhering to the electrode pads 7 by plasma etching involving plasma sputtering. Also, FIG. 11 is a graph of the relationship between resistance and thickness of the electrode pads 7. This graph was produced by measuring the resistance with respect to the thickness of the electrode pads 7 as preset under two sets of conditions. More specifically, the relationship between resistance and thickness of the electrode pads 7 referred to here is the relationship between the resistance between two predetermined electrode pads 7 (specifically, the electrode pads 76 and 77 in the case of FIG. 9, and the electrode pads 71 and 74 in the case of FIG. 10) and the thickness of these electrode pads 7. One of the above-mentioned two sets of conditions (first conditions) is that the cleaning in the cleaning step is performed three times by plasma sputtering, and the cleaning in each cleaning step is carried out for a plasma duration of 120 seconds at 400 W. The other set of conditions (second conditions) is that the cleaning in the cleaning step is performed five times by plasma sputtering, and the cleaning in each cleaning step is carried out for a plasma duration of 180 seconds at 600 W. The first and second conditions are differentiated in the cleaning strength, cleaning time, and number of cleanings. As shown in FIG. 11, the resistance value is dramatically lower if thickness of the gold plating of the electrode pads 7 is over about 1.0 μm. This is related to the fact that under both sets of conditions, not only is any dust, solvent, oxide thin film adhering to the gold plating of the electrode pads 7 removed, but the surface of the gold plating of the electrode pads 7 is shaved away more than necessary. Consequently, there is the possibility that electrode dust from electrode pads 7 removed more than necessary will cause short-circuiting due to connection between electrode pads 7 that serve as hetero electrodes.

As discussed above, in this working example and modifications thereof, since the thickness of the gold plating of the electrode pads 7 is 1.0 μm or less, it is possible to avoid short-circuiting between adjacent electrode pads 7 caused by electrode dust from electrode pads 7 that scatters in the formation of the electrode pads 7. This configuration is particularly preferable when the electrode pads 7 on the base 4 are to be cleaned by plasma sputtering, and furthermore this is preferable for solving the same problems encountered with dry etching methods in general, and not just the above-mentioned plasma sputtering. As a result, there is greater latitude in the design of the electrode pads 7 on the inner face with the same planar direction (the horizontal face 14).

Further, in this working example and modifications thereof, the gold plating of the electrode pads 7 was given as an example of what is cleaned in the cleaning step, but the present invention is not limited to this, and what is cleaned in the cleaning step is the material formed on top (the uppermost layer) of the electrode pads 7, and this may be another material. The material formed on the uppermost layer of the electrode pads 7 is also the material of the joint with the electronic components (the crystal resonator plate 2 and the integrated circuit board 3) mounted on the base 4.

Figure 12:
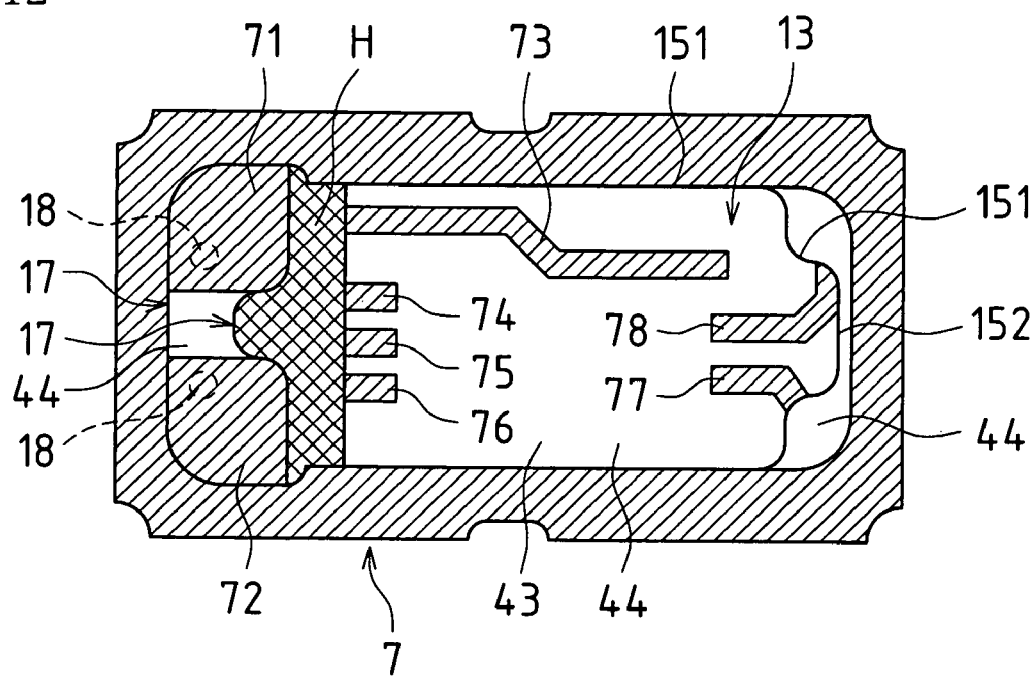
FIG. 12 is a simplified plan view of a base on which an insulating film has been formed in the crystal oscillator according to this working example.

This working example is not limited to the configuration discussed above, and in addition to the above-described configuration shown in FIG. 3, if an insulating film H of alumina or the like is formed over part of the horizontal face 14 from the intersection line 17 of the electrode pads 7 as shown in FIG. 12, the effect of preventing short-circuiting on the horizontal face 14 will be enhanced.

The present invention can be worked in various other forms without departing from the concept or the main features thereof. Therefore, the working examples given above are in all respects nothing but examples, and should not be construed as being limiting in nature. The scope of the present invention is what is given by the Claims, and is in no way restricted by this Specification. Furthermore, all changes and modifications according to a scope equivalent to the Claims are within the scope of the present invention.

This application claims prior right on the basis of Japanese Patent Application No. 2005-286563, which was filed in Japan on Sep. 30, 2005, and the entire content thereof is incorporated into this application by reference thereto.

INDUSTRIAL APPLICABILITY

The present invention can be applied to piezoelectric oscillators, piezoelectric resonators, and other such piezoelectric resonator devices.

The invention claimed is:

1. A piezoelectric resonator device,
in which a package is constituted by a base and a lid, and on the base are formed a plurality of electrode pads for supporting a piezoelectric resonator plate on which an electrode terminal is formed, and for putting the electrode terminal of the piezoelectric resonator plate in a state of conduction with an external electrode,
wherein an inner peripheral face of the package of the base is made up of a plurality of inner horizontal and vertical faces,
the base is composed of a bottom portion, a surface thereof being the horizontal face, and a laminated portion being laminated on the bottom portion,
the plurality of electrode pads are formed adjacently on the surface of the bottom portion,
the horizontal face being the surface of the bottom portion and the plurality of vertical faces intersect at a single intersection line at which substantially three faces intersect with the bottom portion,
in the electrode pads that are formed adjacently on the surface of the bottom portion, a distance between the adjacent electrode pads along this intersection line on the surface of the bottom portion is longer than the shortest distance between the adjacent electrode pads, and
the electrode pads are composed of a plurality of layers, and the thickness of an uppermost layer is not more than 1.0 μm.

2. The piezoelectric resonator device according to claim 1, wherein floating electrode pads are formed on the inner face having the same planar direction away from the intersection line.

3. The piezoelectric resonator device according to claim 2, wherein the number of electrode pads formed on the inner face having the same planar direction that includes the intersection line is greater than the number of floating electrode pads.

4. The piezoelectric resonator device according to claim 1, wherein the base has a laminated portion formed on a bottom portion, through-holes are provided at or near a location on the bottom portion where the laminated portion is formed, and the electrode pads inside the package are electrically connected to the outside of the package via the through-holes.

5. The piezoelectric resonator device according to claim 4, wherein electrodes are formed on inner peripheral faces of the through-holes, and center portions of the through-holes are filled with a resin.

6. The piezoelectric resonator device according to claim 1, wherein a distance between adjacent electrode pads along the intersection line is set to at least 100 μm and the shortest distance between adjacent electrode pads on the inner face having the same planar direction is set to less than 100 μm.

7. A piezoelectric resonator device, in which a package is constituted by a base and a lid, and on the base are formed a plurality of electrode pads for supporting a piezoelectric resonator plate and an integrated circuit board on which electrode terminals are formed, and for putting at least the electrode terminals of the integrated circuit board in a state of conduction with an external electrode and an internal terminal, wherein an inner peripheral face of the package of the base is made up of a plurality of inner horizontal and vertical faces, the base is composed of a bottom portion, a surface thereof being the horizontal face, and a laminated portion being laminated on the bottom portion, the plurality of electrode pads are formed adjacently on the surface of the bottom portion, the horizontal face being the surface of the bottom portion and the plurality of vertical faces intersect at a single intersection line at which substantially three faces intersect with the bottom portion, in the electrode pads that are formed adjacently on the surface of the bottom portion, a distance between the adjacent electrode pads along this intersection line on the surface of the bottom portion is longer than the shortest distance between the adjacent electrode pads, and the electrode pads are composed of a plurality of layers, and the thickness of an uppermost layer is not more than 1.0 μm.

8. The piezoelectric resonator device according to claim 7, wherein floating electrode pads are formed on the inner face having the same planar direction away from the intersection line.

9. The piezoelectric resonator device according to claim 7, wherein the base has a laminated portion formed on a bottom portion, through-holes are provided at or near a location on the bottom portion where the laminated portion is formed, and the electrode pads inside the package are electrically connected to the outside of the package via the through-holes.

10. The piezoelectric resonator device according to claim 7, wherein a distance between adjacent electrode pads along the intersection line is set to at least 100 μm and the shortest distance between adjacent electrode pads on the inner face having the same planar direction is set to less than 100 μm.

* * * * *